(12) United States Patent
Almalki et al.

(10) Patent No.: US 9,146,285 B2
(45) Date of Patent: Sep. 29, 2015

(54) METHODS AND DEVICES FOR DETECTING MAGNETIC INTERFERENCE AFFECTING THE OPERATION OF A MAGNETOMETER

(75) Inventors: Nazih Almalki, Waterloo (CA); Jeffrey Alton Hugh Dods, Kitchener (CA); Jeffrey Charles Bos, Waterloo (CA)

(73) Assignee: BLACKBERRY LIMITED, Waterloo (CA)

( * ) Notice: Subject to any disclaimer, the term of this patent is extended or adjusted under 35 U.S.C. 154(b) by 910 days.

(21) Appl. No.: 13/365,281

(22) Filed: Feb. 3, 2012

(65) Prior Publication Data

US 2013/0200882 A1 Aug. 8, 2013

(51) Int. Cl.
| | | |
|---|---|---|
| G01R 35/00 | (2006.01) | |
| G01R 33/00 | (2006.01) | |
| G01R 33/028 | (2006.01) | |
| G01C 17/38 | (2006.01) | |

(52) U.S. Cl.
CPC .......... *G01R 33/0035* (2013.01); *G01R 33/028* (2013.01); *G01C 17/38* (2013.01)

(58) Field of Classification Search
None
See application file for complete search history.

(56) References Cited

U.S. PATENT DOCUMENTS

| | | | |
|---|---|---|---|
| 7,523,559 B2 | 4/2009 | Fillatreau et al. | |
| 7,921,572 B2 | 4/2011 | Mayor et al. | |
| 2008/0071492 A1 | 3/2008 | Skvortsov et al. | |
| 2009/0070056 A1 | 3/2009 | Vocali et al. | |
| 2009/0167295 A1 | 7/2009 | Chen et al. | |
| 2010/0307016 A1 | 12/2010 | Mayor et al. | |
| 2010/0312509 A1 | 12/2010 | Patel et al. | |
| 2010/0312510 A1 | 12/2010 | Piemonte et al. | |
| 2010/0324862 A1* | 12/2010 | Sato et al. ...................... 702/150 |
| 2011/0131825 A1 | 6/2011 | Mayor et al. | |

OTHER PUBLICATIONS

Document relating to CA Application No. 2,803,376 dated Jul. 30, 2014 (Office Action).
Extended European Search Report, European Patent Application No. 12153777.3, dated Mar. 29, 2012.
Document relating to EP Application No. 12153777, dated Sep. 2, 2014 (Intention to Grant).
Document relating to EP Application No. 12153777.3, dated Aug. 12, 2013 (EP Communication Pursuant to Rules 70(2)).
Document relating to EP Application No. 12153777.3, dated Feb. 7, 2014 (Response to Extended European Search Report).

* cited by examiner

*Primary Examiner* — Melissa Koval
*Assistant Examiner* — Stephen G Armstrong
(74) *Attorney, Agent, or Firm* — Perry + Currier Inc.

(57) ABSTRACT

Methods and apparatus employing non-magnetometer navigational sensor data to assist in determining whether a change in a magnetic field detected by a magnetometer is likely due to a source of internal or external magnetic interference, and more generally, whether such interference is likely to be persistent or transient. If the magnetic field data detected by the magnetometer indicates a large change in magnetic field, but the non-magnetometer navigational sensor (e.g., gyroscope) data does not indicate a corresponding change in orientation of the mobile device contemporaneous with the change in magnetic field, then the cause of the magnetic field change may be determined as likely originating from a localized external interference source and the device may prompt the user to move away from the interference source, rather than initiating a recalibration of the magnetometer.

22 Claims, 11 Drawing Sheets

METHODS AND DEVICES FOR DETECTING MAGNETIC INTERFERENCE AFFECTING THE OPERATION OF A MAGNETOMETER

FIELD

The various embodiments described herein relate generally to magnetometers and, in particular, to magnetometers employed in devices such as mobile devices.

INTRODUCTION

A magnetometer is an instrument used to measure the strength and/or direction of the magnetic field in the vicinity of the instrument. Many electronic devices exist that utilize a magnetometer for taking measurements for a particular application, e.g. metal detectors, navigation instruments, aerospace equipment, and the like.

Mobile devices, such as cellular telephones, personal digital assistants (PDAs), smart phones, tablet computers, and the like, may also incorporate a magnetometer for use by one or more application modules of the device. In such cases, the magnetometer can be used to measure the strength and direction of the Earth's magnetic field. For example, a mobile device may include a virtual compass application for showing a compass bearing on a display of the device, where the compass bearing may be determined at least in part from output provided by a magnetometer in the mobile device.

DRAWINGS

For a better understanding of the various embodiments described herein, and to show more clearly how these various embodiments may be carried into effect, reference will be made, by way of example, to the accompanying drawings which show at least one example embodiment, and in which.

DESCRIPTION OF VARIOUS EMBODIMENTS

Figure 1:
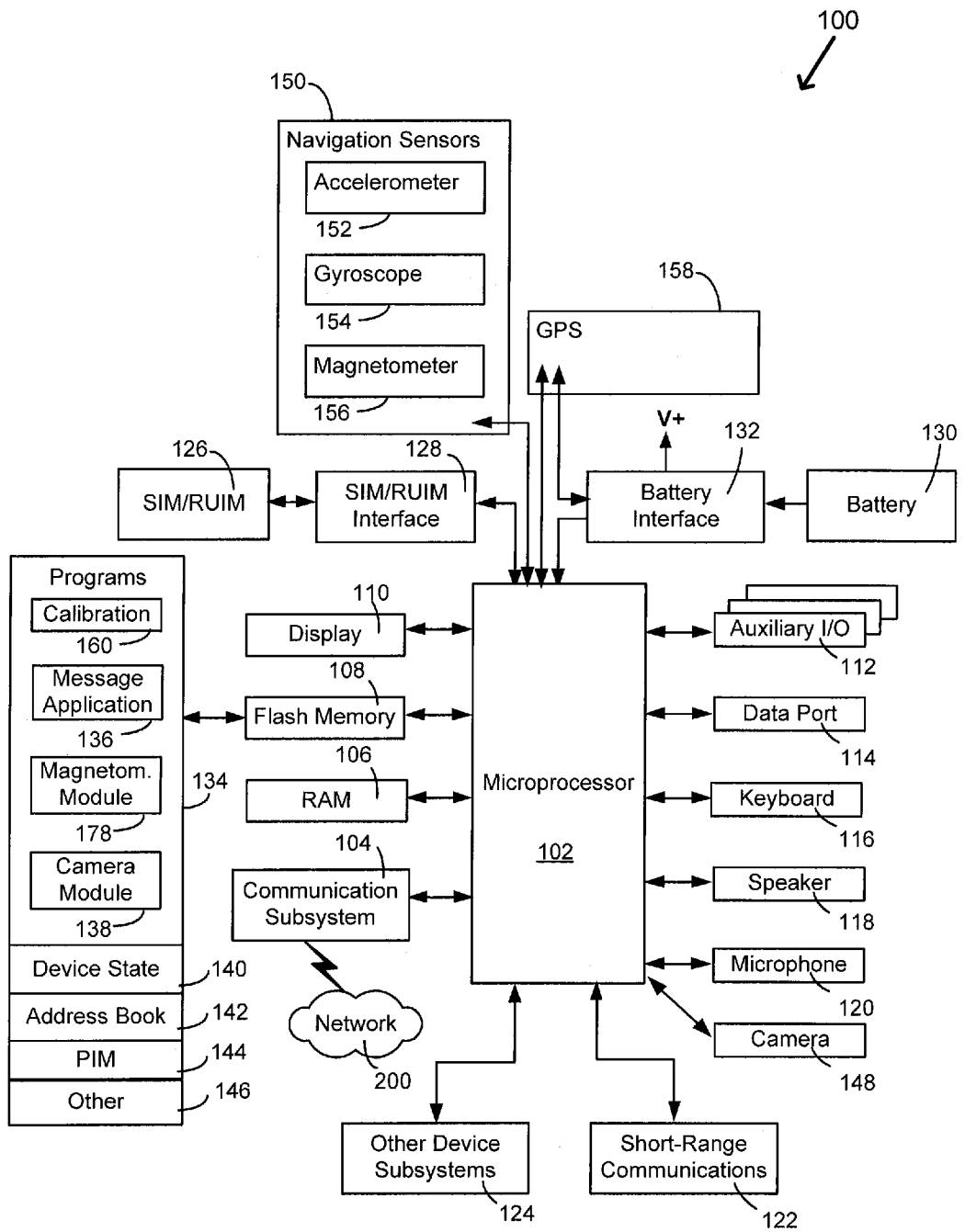
FIG. 1 is a block diagram of a mobile device in one example embodiment.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the description of various embodiments herein. Also, the description is not to be considered as limiting the scope of the embodiments described herein. It should also be noted that the term coupled indicates that two elements can be directly coupled to one another or coupled to one another through one or more intermediate elements.

In a broad aspect, there is provided a method for detecting magnetic interference in a mobile device. The method may comprise: monitoring magnetometer sensor data generated by a magnetometer for a first time interval; detecting a change in the magnetometer sensor data for the first time interval; computing expected motion data that characterizes an expected motion of the mobile device based on the magnetometer sensor data; comparing the expected motion data with reference data; and deferring recalibration of the magnetometer when the expected motion data does not correspond to the reference data.

The method may further comprise, prior to computing the expected motion data, computing the reference data of the mobile device based on non-magnetometer sensor data.

The non-magnetometer sensor data may be generated at the mobile device, and may be generated by one or more non-magnetometer sensors in the first time interval.

The deferring may comprise displaying an indication of a corrective action in a user interface of the mobile device. The indication may identify that magnetic interference is present near the mobile device. The corrective action may comprise moving the mobile device and/or removing a possible source of the magnetic interference.

The deferring may comprise monitoring the magnetometer sensor data for a second time interval and computing new expected motion data of the mobile device based on the magnetometer sensor data for the second time interval, and, if the new expected motion data does not correspond to new reference data, the method may further comprise recalibrating the magnetometer.

If the new expected motion data corresponds to the new reference data, the method may further comprise cancelling recalibration of the magnetometer.

The magnetic field change may exceed a predetermined change threshold.

The one or more non-magnetometer sensors may comprise an accelerometer, a gyroscope and/or a GPS unit.

In another broad aspect, there is provided a non-transitory computer readable medium storing instructions executable by a processor of a mobile device, the instructions for carrying out a method for detecting magnetic interference in the mobile device.

In another broad aspect, there is provided a mobile device comprising a magnetometer; one or more sensors; and a processor coupled to the magnetometer and the one or more sensors, the processor configured to carry out a method for detecting magnetic interference in the mobile device.

Many computing applications, and mobile computing applications in particular, may utilize direction data as provided by a magnetometer (e.g., digital compass). Depending on the specific application, the direction data should sense the magnetic field (e.g., the Earth's magnetic field) as accurately as reasonably possible.

Mobile devices can operate in many different locations and environments. Changes in the environment in which the mobile device operates can affect the operation of the magnetometer. To better ensure that magnetometer readings are accurate, the magnetometer may need to be calibrated or recalibrated at certain times.

A magnetometer can be calibrated one or more times to characterize the magnetometer response and to account for magnetic interference resulting from the surroundings of the magnetometer. For example, a magnetometer may be calibrated in a controlled test environment when it is first produced. Subsequently, the magnetometer may be recalibrated when it is placed on a printed circuit board (PCB) within a mobile device. A recalibration may account for internal magnetic interference originating from the mobile device itself, which may be caused by metal antennas or other sources of magnetic interference originating from the mobile device.

The quality (e.g., accuracy and reliability) of magnetic field data provided by the magnetometer is generally expected to be high following calibration or recalibration.

Recalibration of the magnetometer can be performed in a number of ways, such as a foreground recalibration or a background recalibration. A foreground recalibration may require action from a user of the mobile device. For example, the display of the mobile device may prompt a user to move the mobile device in a specified pattern (e.g., a figure eight motion) while the magnetometer is calibrated. In contrast, a background recalibration may be carried out automatically by the mobile device without requiring user intervention (e.g., by capturing sensor data silently and initiating a calibration routine once sufficient sensor data has been collected).

Recalibration may increase computing and power requirements. For example, frequent recalibration may increase the rate of depletion of a battery and increase the computational load placed on a microprocessor of a mobile device. Moreover, foreground recalibrations generally involve user interaction, which can adversely affect usability of the mobile device.

Nevertheless, magnetometer recalibrations may become necessary over time to ensure that readings are accurate. For example, the internal magnetic interference of the mobile device may change over time. Accordingly, the quality of the magnetic field data provided by the magnetometer may decrease if the magnetometer is not recalibrated.

In operation, a mobile device comprising a magnetometer may also encounter sources of external magnetic interference in its environment. Examples of external magnetic interference sources may include objects containing iron or other magnetic materials, such as doorways, vehicles, and the like. Likewise, electromagnetic sources external to the mobile device, such as electrical wiring in the surrounding environment, may also cause magnetic interference.

In general, changes to the levels of internal or external magnetic interference that may affect the operation of a magnetometer may require a recalibration of the magnetometer to maintain a high quality of data output by the magnetometer. However, a recalibration whenever a change in the level of interference is detected may not be appropriate in all cases.

For example, in the case of a stationary external interference source such as a metal doorway, once the mobile device is moved away from the external interference source, the magnetic interference typically subsides and the need for recalibration may be diminished or eliminated.

In fact, if the magnetometer were to be recalibrated while exposed to a source of external interference that is transient in nature, the magnetometer may produce inaccurate data once the mobile device is moved away from the source of external interference. Accordingly, further recalibration would then be necessary.

On the other hand, if the mobile device is moved within range of magnetic interference that has persisted for some length of time, it may be desirable to trigger a recalibration under those circumstances to correct for the interference since the magnetic interference may be expected to continue to persist for a prolonged period of time.

It can be difficult to distinguish between changes originating from internal interference sources and changes originating from external interference sources. More generally, it can be difficult to distinguish between transient and persistent sources of interference. Recalibration may be less desirable when a magnetometer is exposed to transient sources of interference (namely, interference that may affect the operation of the magnetometer temporarily for a relatively short period of time), as the recalibration process may consume computing and battery resources unnecessarily. Conversely, recalibration may be more desirable when a magnetometer is exposed to persistent sources of interference, to ensure a consistently high level quality of the magnetometer data on an ongoing basis.

Magnetometers can be classified as a type of navigational sensor. That is, magnetometers can be used for the purposes of navigation, orientation, and/or position determination. Many mobile devices may be equipped with several additional, non-magnetometer navigational sensors, such as accelerometers and gyroscopes, in addition to a magnetometer. An accelerometer is a sensor, which, when operable, obtains or otherwise acquires data including the acceleration of an inertial reference frame relative to the accelerometer. A gyroscope is a sensor, which, when operable, obtains or otherwise acquires data including a device's orientation relative to one or more axes. Other examples of non-magnetometer navigational sensors may include Global Positioning System (GPS) components, or the like.

A combination of magnetometer and non-magnetometer navigational sensors may be provided on a mobile device, and used for navigational purposes to determine the position, orientation and motion of the mobile device in, for example, six degrees of freedom.

In accordance with at least one embodiment described herein, the availability of data provided by one or more non-magnetometer navigational sensors are used to assist in determining whether a change in a magnetic field detected by a magnetometer is likely due to a source of internal or external magnetic interference, and more generally, whether such interference is likely to be persistent or transient. In particular, by determining whether magnetic field data from the magnetometer suggests a movement (or non-movement) of the mobile device that is consistent with data measured by the one or more non-magnetometer navigational sensors, anomalous readings obtained by the magnetometer may be classified as either transient or persistent, and the appropriate corrective action, if any is desired, can be determined.

In one example, if the magnetic field data detected by the magnetometer indicates a large change in compass bearing, but the non-magnetometer navigational sensor (e.g., gyroscope) data does not indicate that a corresponding rotation of the mobile device has occurred contemporaneously with the change in compass bearing, then the cause of the magnetic heading change may be determined as most likely originating from a localized external interference source (e.g., a metal doorway, vehicle, etc.), and the device may prompt the user to move away from the interference source, rather than initiating a recalibration of the magnetometer.

In another example, if the magnetic field data detected by the magnetometer fluctuates repeatedly, but the non-magnetometer navigational sensor (e.g., gyroscope) data does not indicate motion of the mobile device corresponding to the fluctuations, a recalibration of the magnetometer may be initiated.

To aid the reader in understanding the structure of an example implementation of a mobile device, reference will be made to FIGS. 1 to 3. However, it should be understood that the embodiments described herein are not limited to a mobile device but can be extended to any electronic device that includes an image sensor and at least one navigational sensor. Examples of such electronic devices may include any portable electronic device such as cellular phones, cellular smartphones, wireless organizers, personal digital assistants, computers, laptops, handheld wireless communication devices, wireless enabled notebook computers, tablet computers or e-readers, electronic security devices, wireless Internet appliances and the like. The electronic devices listed herein which are mobile are generally portable and thus are battery-powered and may have limited processing power. While some of these devices include wireless communication capability, others are standalone devices that do not communicate with other devices.

Referring to FIG. 1, shown therein is a block diagram of one example of a mobile device 100. The mobile device 100 comprises a number of components, the controlling component being a microprocessor 102, which controls the overall operation of the mobile device 100. Communication functions, including data and voice communications, are performed through a communication subsystem 104. The communication subsystem 104 receives messages from and sends messages to a wireless network 200. In this example, the communication subsystem 104 is configured in accordance with the Global System for Mobile Communication (GSM) and General Packet Radio Services (GPRS) standards. In other embodiments, the communication subsystem 104 can be configured in accordance with other communication standards as described below. New standards are still being defined, and it will be understood by persons skilled in the art that the various embodiments described herein should be able to be adapted to work with any other suitable standards that are developed in the future. The wireless link connecting the communication subsystem 104 with the wireless network 200 represents one or more different Radio Frequency (RF) channels, operating according to defined protocols specified for GSM/GPRS communications. With newer network protocols, these channels are capable of supporting both circuit-switched voice communications and packet-switched data communications.

Although the wireless network 200 associated with the mobile device 100 is a GSM/GPRS wireless network in this example, the mobile device 100 can be adapted to use other wireless networks in variant embodiments. For example, the different types of wireless networks that can be employed include, but are not limited to, data-centric wireless networks, voice-centric wireless networks, and dual-mode networks that can support both voice and data communications over the same physical base stations. Examples of networks also include, but are not limited to, Code Division Multiple Access (CDMA), CDMA2000 networks, GSM/GPRS networks, 3G networks like EDGE, W-CDMA and UMTS, 4G/LTE networks and future technologies such as 5G networks. Some other examples of data-centric networks include WiFi 802.11, Mobitex™ and DataTAC™ network communication systems. Examples of voice-centric data networks include Personal Communication Systems (PCS) networks like GSM and Time Division Multiple Access (TDMA) systems. Examples of communication protocols/standards that the mobile device 100 can be adapted to be used with include, but are not limited to, 3GPP and 3GPP2, High-Speed Packet Access (HSPA) standards such as High-Speed Downlink Packet Access (HSDPA), 3GPP LTE, LTE, LTE Advanced, WiMax, and Flash-OFDM.

The microprocessor 102 may also interact with additional subsystems such as, for example, a Random Access Memory (RAM) 106, a flash memory 108, a display 110, an auxiliary input/output (I/O) subsystem 112, a data port 114, a keyboard 116, a speaker 118, a microphone 120, short-range communications subsystem 122 and other device subsystems 124.

Some of the subsystems of the mobile device 100 perform communication-related functions, whereas other subsystems can provide "resident" or on-device functions. By way of example, the display 110 and the keyboard 116 can be used for both communication-related functions, such as entering a text message for transmission over the network 200, and device-resident functions such as a calculator or task list. Operating system software used by the microprocessor 102 is typically stored in a persistent store such as the flash memory 108, which can alternatively be a non-volatile memory (e.g., ROM, NVRAM, etc.) or similar storage element (not shown). Those skilled in the art will appreciate that the operating system, specific device applications, or parts thereof, can be temporarily loaded into a volatile store such as the RAM 106.

The mobile device 100 can send and receive communication signals over the wireless network 200 after network registration or activation procedures have been completed. Network access may be associated with a subscriber or user of the mobile device 100. To identify a subscriber, the mobile device 100 may use a SIM/RUIM card 126 (i.e. Subscriber Identity Module or a Removable User Identity Module) to be inserted into a SIM/RUIM interface 128 in order to communicate with a network. The SIM card or RUIM 126 is one type of a conventional "smart card" that can be used to identify a subscriber of the mobile device 100 and to personalize the mobile device 100, among other things. Without the SIM card 126, the mobile device 100 is not fully operational for communication with the wireless network 200. By inserting the SIM card/RUIM 126 into the SIM/RUIM interface 128, a subscriber can access all subscribed services. Services may include, for example: web browsing and messaging such as e-mail, voice mail, SMS, and MMS. More advanced services may include, for example: point of sale, field service and sales force automation. The SIM card/RUIM 126 typically includes a processor and memory for storing information. Once the SIM card/RUIM 126 is inserted into the SIM/RUIM interface 128, it is coupled to the microprocessor 102. In order to identify the subscriber, the SIM card/RUIM 126 contains some user parameters such as an International Mobile Subscriber Identity (IMSI). An advantage of using the SIM card/RUIM 126 is that a subscriber is not necessarily bound by any single physical mobile device. The SIM card/RUIM 126 can store additional subscriber information for a mobile device as well, including datebook (or calendar) information and recent call information. Alternatively, user identification information can also be programmed into a memory, such as the flash memory 108.

The mobile device 100 is typically a battery-powered device and includes a battery interface 132 and may use one or more rechargeable batteries in a battery unit 130. The battery interface 132 may be coupled to a regulator (not shown), which assists the battery unit 130 in providing power V+ to the mobile device 100. Alternatively, the battery unit 130 can be a smart battery as is known in the art. Smart batteries generally include a battery processor, battery memory, switching and protection circuitry, measurement circuitry and a battery pack that includes one or more batteries, which are generally rechargeable. In either case, the one or more batteries in the battery unit 130 can be made from lithium, nickel-cadmium, lithium-ion, or other suitable composite material.

The microprocessor 102, in addition to its operating system functions, enables execution of software applications 134 on the mobile device 100. The subset of software applications 134 that control basic device operations, including data and voice communication applications, will normally be installed on the mobile device 100 during its manufacture. When the microprocessor 102 is executing any of the software applications 134, the microprocessor 102 can be considered to be configured to execute a number of steps according to the methods specified by the code of the software applications 134.

The software applications 134 may include a message application 136 that can be any suitable software program that allows a user of the mobile device 100 to send and receive electronic messages. Various alternatives exist for the message application 136 as is well known to those skilled in the art. Messages that have been sent or received by the user are typically stored in the flash memory 108 of the mobile device 100 or some other suitable storage element in the mobile device 100. Alternatively, some of the sent and received messages can be stored remotely from the device 100 such as in a data store of an associated host system that the mobile device 100 communicates with. For instance, in some cases, only recent messages can be stored within the device 100 while the older messages can be stored in a remote location such as the data store associated with a message server. This can occur when the internal memory of the device 100 is full or when messages have reached a certain "age", i.e. messages older than 3 months can be stored at a remote location. As a further alternative, all messages can be stored in a remote location while only recent messages can be stored on the mobile device 100.

The mobile device 100 may include, for example, a camera module 138, a device state module 140, an address book 142, a Personal Information Manager (PIM) 144, and other modules 146. The camera module 138 is used to control the camera operation for the mobile device 100, which includes obtaining raw thumbnail image data associated with images taken by an image sensor of the mobile device 100, preprocessing the raw thumbnail image data, and displaying the processed thumbnail image data on the display 110.

The device state module 140 provides persistence, i.e. the device state module 140 ensures that important device data is stored in persistent memory, such as the flash memory 108, so that the data is not lost when the mobile device 100 is turned off or loses power. The address book 142 provides information for a list of contacts for the user. For a given contact in the address book 142, the information can include the name, phone number, work address and email address of the contact, among other information. The other modules 146 can include a configuration module (not shown) as well as other modules that can be used in conjunction with the SIM/RUIM interface 128.

The PIM 144 has functionality for organizing and managing data items of interest to a subscriber, such as, but not limited to, e-mail, calendar events, voice mails, appointments, and task items. A PIM application has the ability to send and receive data items via the wireless network 200. PIM data items can be seamlessly integrated, synchronized, and updated via the wireless network 200 with the mobile device subscriber's corresponding data items stored and/or associated with a host computer system. This functionality creates a mirrored host computer on the mobile device 100 with respect to such items. This can be particularly advantageous when the host computer system is the mobile device subscriber's office computer system.

Additional applications can also be loaded onto the mobile device 100 through at least one of the wireless network 200, the auxiliary I/O subsystem 112, the data port 114, the short-range communications subsystem 122, or any other suitable device subsystem 124. This flexibility in application installation increases the functionality of the mobile device 100 and can provide enhanced on-device functions, communication-related functions, or both. For example, secure communication applications can enable electronic commerce functions and other such financial transactions to be performed using the mobile device 100.

In some embodiments, one or more magnetometer modules 178 may be loaded onto the mobile device 100. Magnetometer modules 178 may be configured to provide data based on the detection of a magnetic field, such as navigation aids (e.g., virtual compass) and the like.

The data port 114 enables a subscriber to set preferences through an external device or software application and extends the capabilities of the mobile device 100 by providing for information or software downloads to the mobile device 100 other than through a wireless communication network. The alternate download path can, for example, be used to load an encryption key onto the mobile device 100 through a direct and thus reliable and trusted connection to provide secure device communication.

The data port 114 can be any suitable port that enables data communication between the mobile device 100 and another computing device. The data port 114 can be a serial or a parallel port. In some instances, the data port 114 can be a USB port that includes data lines for data transfer and a supply line that can provide a charging current to charge the mobile device 100.

The short-range communications subsystem 122 provides for communication between the mobile device 100 and different systems or devices, without the use of the wireless network 200. For example, the subsystem 122 can include an infrared device and associated circuits and components for short-range communication. Examples of short-range communication may include, for example, standards developed by the Infrared Data Association (IrDA), Bluetooth, and the 802.11 family of standards developed by IEEE.

In use, a received signal such as a text message, an e-mail message, or web page download will be processed by the communication subsystem 104 and input to the microprocessor 102. The microprocessor 102 will then process the received signal for output to the display 110 or alternatively to the auxiliary I/O subsystem 112. A subscriber can also compose data items, such as e-mail messages, for example, using the keyboard 116 in conjunction with the display 110 and possibly the auxiliary I/O subsystem 112. The auxiliary subsystem 112 can include devices such as a touch screen, mouse, track ball, infrared fingerprint detector, or a roller wheel with dynamic button pressing capability. The keyboard 116 is preferably an alphanumeric keyboard and/or telephone-type keypad. However, other types of keyboards can also be used. A composed item can be transmitted over the wireless network 200 through the communication subsystem 104.

For voice communications, the overall operation of the mobile device 100 is substantially similar, except that the received signals are output to the speaker 118, and signals for transmission are generated by the microphone 120. Alternative voice or audio I/O subsystems, such as a voice message recording subsystem, may also be implemented on the mobile device 100. Although voice or audio signal output is accomplished primarily through the speaker 118, the display 110 can also be used to provide additional information such as the identity of a calling party, duration of a voice call, or other voice call related information.

The mobile device 100 may include a camera unit 148 that allows a user of the mobile device 100 to capture images and videos. The camera unit 148 can include a camera controller, a current drive unit, a camera lens sub-unit, a camera flash sub-unit, a camera sensor sub-unit and an image capture input (not shown). The camera controller configures the operation of the camera unit in conjunction with information and instructions received from the microprocessor 102 and the camera module 138.

Mobile device 100 further comprises a navigational sensor unit 150, which may comprise one or more navigational sensors, such as a gyroscope 154, accelerometer 152, and a magnetometer 156. Memory 108 may store calibration parameters or sensor data associated with one or more of the navigational sensors. In some other embodiments, navigational sensor unit 150 may comprise or have access to additional memory (not shown) internal to the navigational sensor unit 150.

Accelerometer 152 is a non-magnetometer sensor operable to obtain or otherwise acquire data such as data measuring the acceleration of an inertial reference frame relative to the accelerometer. Such data can be stored in a data store, such as memory 108. Various applications may utilize the accelerometer sensor data. In one example, an augmented reality application can utilize the accelerometer sensor data to determine the orientation of display 110 (e.g., whether the display is oriented in a landscape or portrait orientation) and to rotate the rendered images within the display 110 accordingly for a user's convenience. It can be appreciated that other applications may also make use of accelerometer data, including for example, a game, level measurement, etc. The applications may use such data to provide output via a user interface (UI) on display 110. An accelerometer calibration module (not shown) may be provided to calibrate accelerometer 152 to improve the quality of the accelerometer sensor data.

Gyroscope 154 is a non-magnetometer sensor operable to obtain or otherwise acquire data such as data measuring the orientation of mobile device 100 relative to one or more axes. Such data can be stored in a data store, such as memory 108. Various applications may utilize the gyroscopic sensor data. In one example, an image stabilization application can utilize the stored gyroscope sensor data to determine when captured images were accompanied by movement (i.e., acceleration) of the mobile device. It can be appreciated that other applications may also make use of gyroscope data, including for example, a game, etc. The applications may use such data to provide output via a UI on display 110. A gyroscope calibration module (not shown) may be provided to calibrate gyroscopic 154 to improve the quality of the gyroscopic sensor data.

Magnetometer 156 is operable to obtain or otherwise acquire data such as data measuring the direction of a magnetic field and its strength. In some cases, magnetometer 156 may provide data representing properties of a three-dimensional magnetic field. For example, the data may comprise a magnetic field vector, comprising a scalar magnitude and angular values (e.g., bearing, azimuth, inclination). Such data can be stored in a data store, such as memory 108. Various applications may utilize the magnetometer sensor data. In one example, a virtual compass application can utilize the magnetometer sensor data to determine and display a compass heading. It can be appreciated that other applications may also make use of magnetometer data, including for example, a stud finder application, a metal detector application, etc. The applications may use such data to provide output via a UI on display 110, e.g. a compass showing the mobile device's heading. A magnetometer calibration module 160 may be provided which, as described herein, can be used to calibrate magnetometer 156 to improve the quality of the magnetometer sensor data.

In some embodiments, a Global Positioning System (GPS) unit 158 may also be provided on mobile device 100. GPS unit 158 is operable to obtain or otherwise acquire position data such as, for example, longitude, latitude and elevation using a global navigation satellite system such as the Global Positioning System, Galileo, GLONASS or the like. Such data can be stored in a data store, such as memory 108. Various applications may utilize the stored GPS unit data.

Navigation sensor unit 150 may provide a data communication interface enabling data communication with microprocessor 102 and various other subsystems of mobile device 100.

Figure 2:
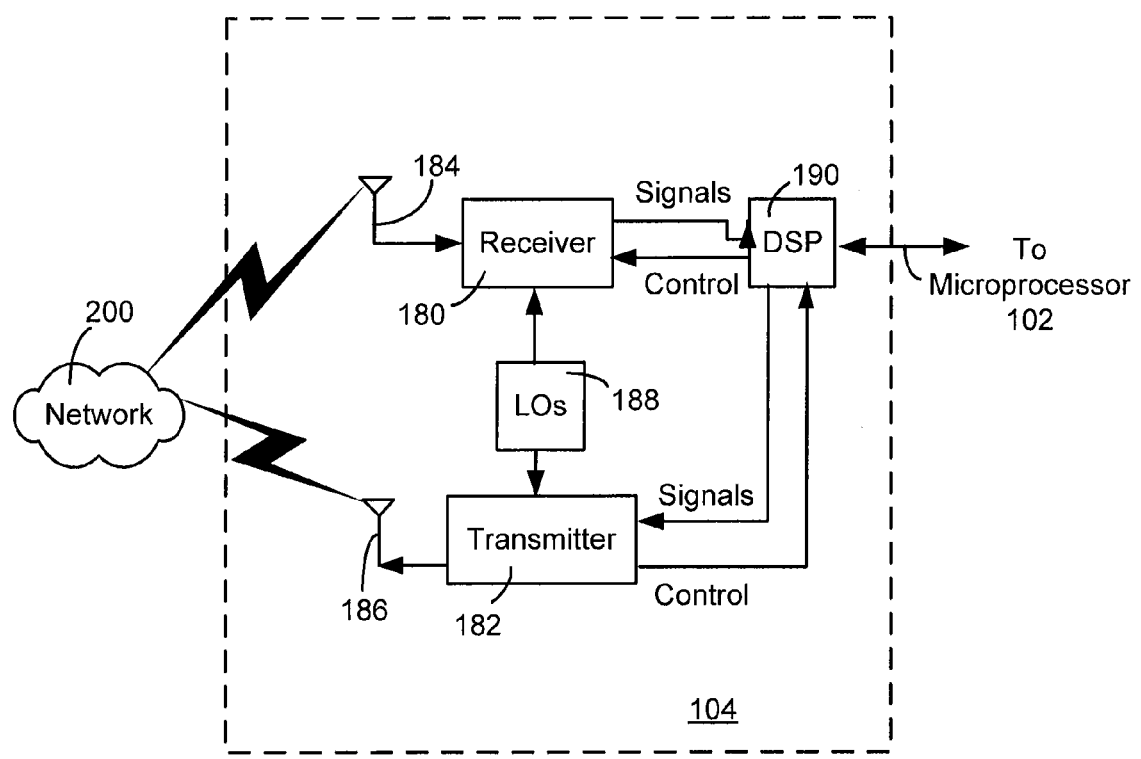
FIG. 2 is a block diagram of an example embodiment of a communication subsystem component of the mobile device of FIG. 1.

Referring now to FIG. 2, a block diagram of the communication subsystem component 104 of FIG. 1 is shown. Communication subsystem 104 comprises a receiver 180, a transmitter 182, one or more embedded or internal antenna elements 184, 186, Local Oscillators (LOs) 188, and a processing module such as a Digital Signal Processor (DSP) 190.

The particular design of the communication subsystem 104 is dependent upon the network 200 in which the mobile device 100 is intended to operate; thus, it should be understood that the design illustrated in FIG. 2 serves only as one example. Signals received by the antenna 184 through the network 200 are input to the receiver 180, which may perform such common receiver functions as signal amplification, frequency down conversion, filtering, channel selection, and analog-to-digital (A/D) conversion. A/D conversion of a received signal allows more complex communication techniques such as demodulation and decoding to be performed in the DSP 190. In a similar manner, signals to be transmitted are processed, including modulation and encoding, by the DSP 190. These DSP-processed signals are input to the transmitter 182 for digital-to-analog (D/A) conversion, frequency up conversion, filtering, amplification and transmission over the network 200 via the antenna 186. The DSP 190 not only processes communication signals, but also provides for receiver and transmitter control. For example, the gains applied to communication signals in the receiver 180 and the transmitter 182 may be adaptively controlled through automatic gain control algorithms implemented in the DSP 190.

The wireless link between the mobile device 100 and a network 200 may contain one or more different channels, typically different RF channels, and associated protocols used between the mobile device 100 and the network 200. An RF channel is a limited resource that must be conserved, typically due to limits in overall bandwidth and limited battery power of the mobile device 100.

When the mobile device 100 is fully operational, the transmitter 182 is typically keyed or turned on only when it is sending to the network 200 and is otherwise turned off to conserve resources. Similarly, the receiver 180 is periodically turned off to conserve power until it is needed to receive signals or information (if at all) during designated time periods.

Figure 3:
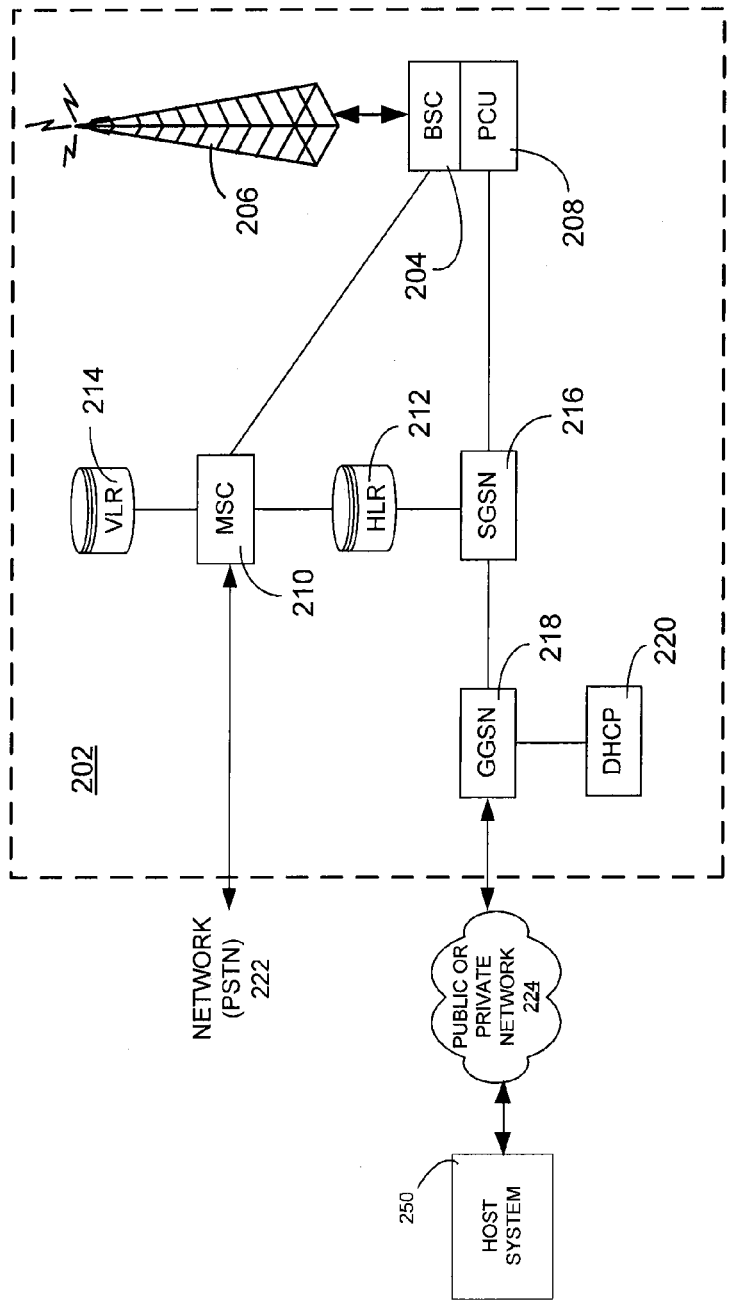
FIG. 3 is a block diagram of a node of a wireless network in one example embodiment.

Referring now to FIG. 3, a block diagram of a node of a wireless network is shown as 202. In this example embodiment, the network and its components are described for operation with General Packet Radio Service (GPRS) and Global Systems for Mobile (GSM) technologies. However, it should be understood that in other embodiments the network can be implemented in accordance with other communication protocols. In practice, the network 200 comprises one or more nodes 202. The mobile device 100 communicates with a node 202 within the wireless network 200. The node 202 may be configured in accordance with GPRS and GSM technologies. The node 202 may include a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that may be commonly used in communications through the network 200.

In a GSM network, the MSC 210 is coupled to the BSC 204 and to a landline network, such as a Public Switched Telephone Network (PSTN) 222 to satisfy circuit switched requirements. The connection through the PCU 208, the SGSN 216 and the GGSN 218 to the public or private network (Internet) 224 (also referred to herein generally as a shared network infrastructure) represents the data path for GPRS capable mobile devices. In a GSM network extended with GPRS capabilities, the BSC 204 also contains a Packet Control Unit (PCU) 208 that connects to the SGSN 216 to control segmentation, radio channel allocation and to satisfy packet switched requirements. To track mobile device location and availability for both circuit switched and packet switched management, the HLR 212 is shared between the MSC 210 and the SGSN 216. Access to the VLR 214 is controlled by the MSC 210.

The station 206 may be a fixed transceiver station in which case the station 206 and the BSC 204 together form the fixed transceiver equipment. The fixed transceiver equipment provides wireless network coverage for a particular coverage area commonly referred to as a "cell". The fixed transceiver equipment transmits communication signals to and receives communication signals from mobile devices within its cell via the station 206. The fixed transceiver equipment normally performs such functions as modulation and possibly encoding and/or encryption of signals to be transmitted to the mobile device in accordance with particular, usually predetermined, communication protocols and parameters, under control of its controller. The fixed transceiver equipment similarly demodulates and possibly decodes and decrypts, if necessary, any communication signals received from the mobile device 100 within its cell. Communication protocols and parameters may vary between different nodes. For example, one node may employ a different modulation scheme and operate at different frequencies than other nodes.

For all mobile devices 100 registered with a specific network, permanent configuration data such as a user profile may be stored in the HLR 212. The HLR 212 may also contain location information for each registered mobile device and can be queried to determine the current location of a mobile device. The MSC 210 is responsible for a group of location areas and stores the data of the mobile devices currently in its area of responsibility in the VLR 214. Further the VLR 214 also contains information on mobile devices that are visiting other networks. The information in the VLR 214 includes part of the permanent mobile device data transmitted from the HLR 212 to the VLR 214 for faster access. By moving additional information from a remote node of the HLR 212 to the VLR 214, the amount of traffic between these nodes can be reduced so that voice and data services can be provided with faster response times while at the same time using less computing resources.

The SGSN 216 and the GGSN 218 are elements added for GPRS support; namely packet switched data support, within GSM. The SGSN 216 and the MSC 210 have similar responsibilities within wireless network 200 by keeping track of the location of each mobile device 100. The SGSN 216 also performs security functions and access control for data traffic on the network 200. The GGSN 218 provides internetworking connections with external packet switched networks and connects to one or more SGSN's 216 via an Internet Protocol (IP) backbone network operated within the network 200. During normal operations, a given mobile device 100 typically performs a "GPRS Attach" to acquire an IP address and to access data services. This would not typically be present in circuit switched voice channels as Integrated Services Digital Network (ISDN) addresses are used for routing incoming and outgoing calls. GPRS capable networks may use private, dynamically assigned IP addresses, and a DHCP server 220 connected to the GGSN 218. There are many mechanisms for dynamic IP assignment, including using a combination of a Remote Authentication Dial-In User Service (RADIUS) server and a DHCP server. Once the GPRS Attach is complete, a logical connection is established from a mobile device 100, through the PCU 208 and the SGSN 216 to an Access Point Node (APN) within the GGSN 218. The APN represents a logical end of an IP tunnel that can either access direct Internet compatible services or private network connections. The APN also represents a security mechanism for the network 200, insofar as each mobile device 100 must be assigned to one or more APNs and the mobile devices 100 cannot exchange data without first performing a GPRS Attach to an APN that it has been authorized to use. The APN may be considered to be similar to an Internet domain name such as "myconnection.wireless.com".

Once the GPRS Attach is complete, a tunnel is created and traffic is exchanged within standard IP packets using any protocol that can be supported in IP packets. This includes tunneling methods such as IP over IP as in the case with some IPSecurity (IPsec) connections used with Virtual Private Networks (VPN). These tunnels are also referred to as Packet Data Protocol (PDP) Contexts and there are a limited number of these available in the network 200. To maximize use of the PDP Contexts, the network 200 will run an idle timer for each PDP Context to determine if there is a lack of activity. When a mobile device 100 is not using its PDP Context, the PDP Context can be deallocated and the IP address returned to the IP address pool managed by the DHCP server 220.

The host system 250 may be a corporate enterprise or other local area network (LAN), but may also be a home office computer or some other private system, for example, in variant embodiments. In some cases, the host system 250 may represent a smaller part of a larger network of an organization. Typically, mobile devices communicate wirelessly with the host system 250 through one or more of the nodes 202 of the wireless network 200. The host system 250 may include one or more routers and computing devices that may operate from behind a firewall or proxy server. The proxy server routes data to the correct destination server(s) within the host system 250. For instance, the host system 250 may include a message server to send and receive messages to the mobile devices and a message management server that controls when, if, and how messages are sent to the mobile devices. The host system 250 can also include other servers that provide various functions for the host system 250 as well as data stores or databases.

Figure 4A:
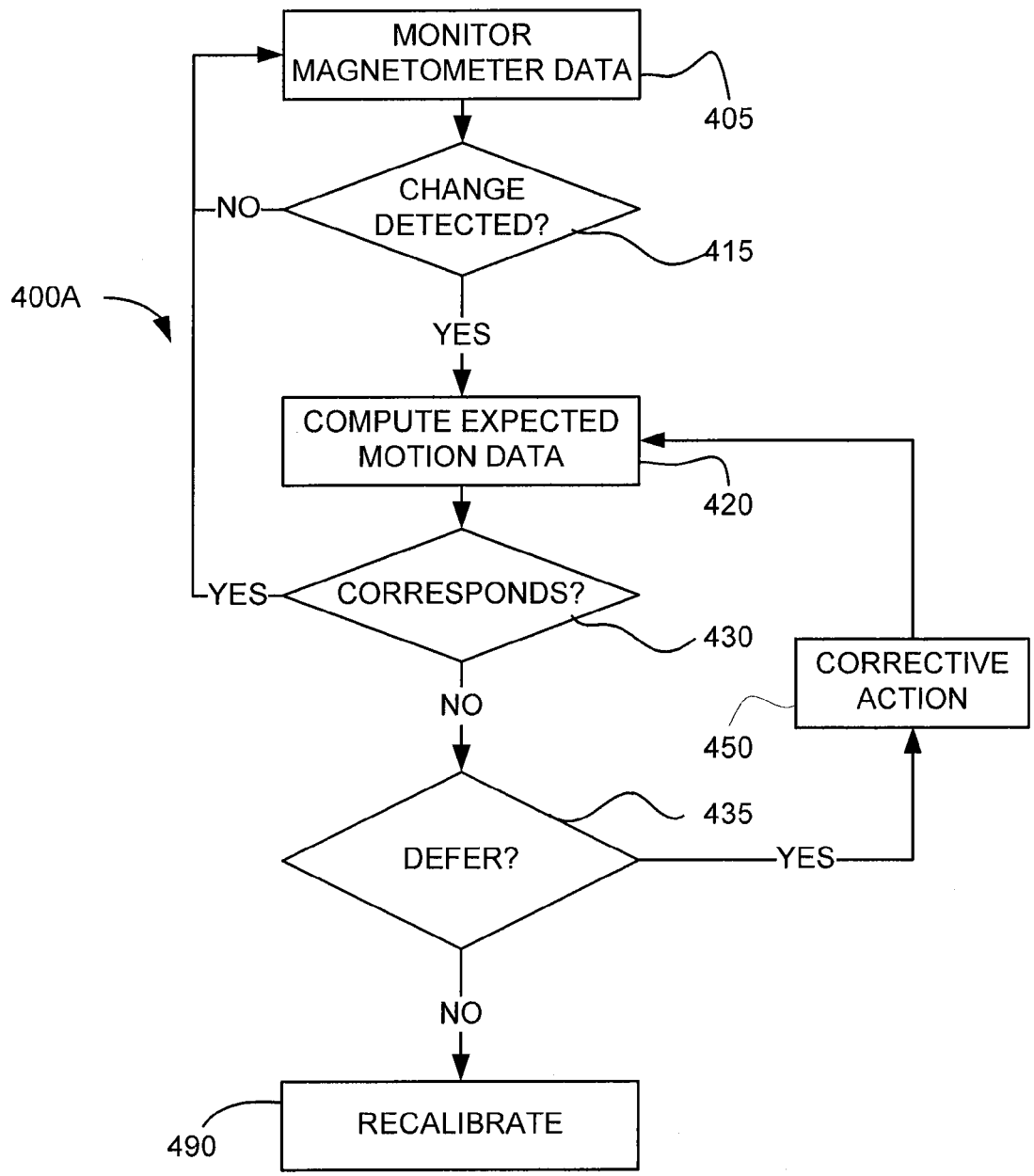
FIG. 4A is a flow chart illustrating an interference detection process.

Referring now to FIG. 4A, there is shown a flow chart illustrating an interference detection process, in accordance with at least one embodiment. Acts of process 400A may be performed, for example, by microprocessor 102 of mobile device 100 (FIG. 1).

Process 400A begins at 405 with the monitoring and/or sampling of sensor data provided by a magnetometer, such as magnetometer 156 (FIG. 1).

Sensor data may be monitored continuously, at intervals having some predefined period, or in response to certain stimuli. For example, magnetometer sensor data may be sampled when gyroscope sensor data indicates that a mobile device has experienced rotation about one or more axis (e.g., suggesting that movement has occurred). Generally, navigational sensors will be active and monitoring contemporaneously (e.g., if the magnetometer is sampling data, then the accelerometer and gyroscope will also be sampling data).

Magnetometer sensor data may comprise data characterizing a magnetic field. For example, the data may be represented as one or more magnetic field vectors, where a magnetic field vector comprises values that quantify a magnitude and direction of a magnetic field. In addition, sensor data obtained from the magnetometer at any given point in time may have one or more timestamps associated therewith. Accordingly, when monitoring magnetometer sensor data, data associated with a plurality of magnetic field vectors may be sampled (e.g., by magnetometer 156) and stored (e.g., in memory 106), to record a change in magnetic field over one or more time intervals.

Non-magnetometer sensor data, such as accelerometer sensor data and gyroscope sensor data, may also be monitored, sampled and stored on the mobile device.

At 415, microprocessor may detect a change in the magnetometer sensor data, for example contemporaneously with the monitoring, sampling and storage of magnetometer sensor data on the mobile device. The change may be determined, for example, by comparing magnetometer sensor data sampled within a given time interval. In some cases, the time interval may be a sampling interval (e.g., the time between consecutive samples) corresponding to a data sampling frequency of the magnetometer or other sensors. In other cases, the time interval may comprise more than one sampling interval (e.g., two or more sampling periods, several seconds, etc.).

Data previously sampled at a time t0 may be compared to the current magnetometer sensor data sampled at a time t1, to determine if a change in the magnetic field exceeding a predetermined threshold has occurred in this first time interval. The predetermined threshold may be based on a minimum change in one or more magnetic field property in the given time interval, such as magnitude or angle (such as azimuth, inclination, or bearing). The predetermined threshold may also be based on a rate of change. For example, if even a relatively small change in a magnetic field property (e.g., 5° angular change) occurs over an improbably short interval (e.g., 10 ms), the predetermined threshold may be met.

At 420, data characterizing an expected motion of the magnetometer (and the mobile device comprising the magnetometer) is computed, based on the magnetometer sensor data in the given time interval. For example, the magnetometer sensor data may indicate a change in the magnetic field that corresponds to a rotation of the magnetometer (and the mobile device) in space.

At 430, the expected motion data computed at 420 is compared to reference data, to determine if the expected motion data corresponds to the reference data. The reference data may indicate an actual motion (e.g., translation, rotation, etc.) of the mobile device in the given time interval, and may be computed based on non-magnetometer sensor data or other data that may indicate a current position and orientation of the mobile device.

The reference data may be computed based on data obtained from one or more non-magnetometer sensors (e.g., accelerometer, gyroscope, GPS unit, etc.), which in at least one embodiment, is provided on the same mobile device as the magnetometer.

In some cases, the reference data may provide a characterization of movement of the mobile device (e.g., in the same given time interval considered at 415) based on the sensor data from the non-magnetometer sensors.

For example, in one approach, a magnetometer may indicate a change in magnetic field that corresponds to a rotation of the mobile device through 20° about one particular axis. A non-magnetometer sensor such as a gyroscope may also indicate that a rotation of the mobile device has occurred. However, the reference data (based on the gyroscope data) may indicate a different angle of the rotation, for example 5°, or possibly no rotation at all. In practice, the movement of the mobile device can be modeled in three dimensions.

In some cases, data from more than one non-magnetometer sensor can be used in combination, to improve accuracy when computing reference data, and specifically, whether or not there has been actual movement of the mobile device through space, and potentially the magnitude or direction of such movement, if any.

At 430, if the expected motion data corresponds with the reference data with the expected change, optionally within a predetermined tolerance, then no further action is required, and the flow of process 400A can return to monitoring sensor data at 405. Similarly, if a recalibration had been initiated or scheduled (e.g., because the expected motion data and reference data were previously not in correspondence), it can be canceled. The predetermined tolerance may be defined to allow for minor discrepancies between the measured or expected change that may occur in ordinary use. For example, the predetermined tolerance may be a percentage value of the measured or expected change (e.g., between 5 and 10%) or other suitable metric.

However, if the expected motion data does not correspond with the reference data, then rather than immediately initiating recalibration of the magnetometer, process 400A can determine at 435 whether to defer recalibration and initiate corrective actions.

As previously discussed, if the source of magnetic interference is transient (e.g., caused by an external object which the mobile device can be moved away from), then recalibration may not be necessary. Accordingly, if recalibration is deferred at 435, the mobile device can generate and display an indication at 450 that the mobile device is experiencing some magnetic interference and, optionally, an indication in a user interface to take some kind of corrective action. One example of a corrective action to be suggested in the user interface would be to move the mobile device away from a source of magnetic interference. Another example of a corrective action to be suggested in the user interface would be to remove a source of magnetic interference (e.g., a strong magnet) from the vicinity of the mobile device.

Subsequently, acts 420 to 435 may be repeated in a further time interval to compute new expected motion data based on magnetometer sensor data for the further time interval, and to compare the new expected motion data to reference data (which may also be recomputed based on non-magnetometer sensor data for the further time interval). This would give the user an opportunity to take the corrective action suggested at 450, or some other action, to eliminate the cause of the magnetometer interference.

For example, new magnetometer sensor data can be sampled at time t2. Using the data sampled at times t0, t1 and t2, data associated with time intervals between t0 and t2 or t1 and t2 can be identified. The new magnetometer sensor data can be used to compute new expected motion data for a second time interval. As with the first time interval, the second time interval may comprise one or more sampling periods.

Similarly, new reference data for the second time interval can be computed based on non-magnetometer sensor data.

When the determination at 435 is to be performed in subsequent iterations, if the difference between the new expected motion data and the new reference data continues to exceed the predetermined tolerance, then a further determination whether to continue deferring recalibration can be made.

The determination to continue deferring recalibration of the magnetometer may be based on a predetermined wait period (e.g., 10 seconds). In some cases, the determination may be based on whether further motion of the mobile device has been detected following display of the corrective action indication.

If the predetermined wait period has been exceeded, or if further motion of the mobile device has not resolved the cause of the magnetic interference detected at 415, a recalibration may be initiated at 490. The recalibration may be a foreground recalibration or a background recalibration, for example. Otherwise, process 400A may return to 420 to repeat acts 420 to 435.

Figure 4B:
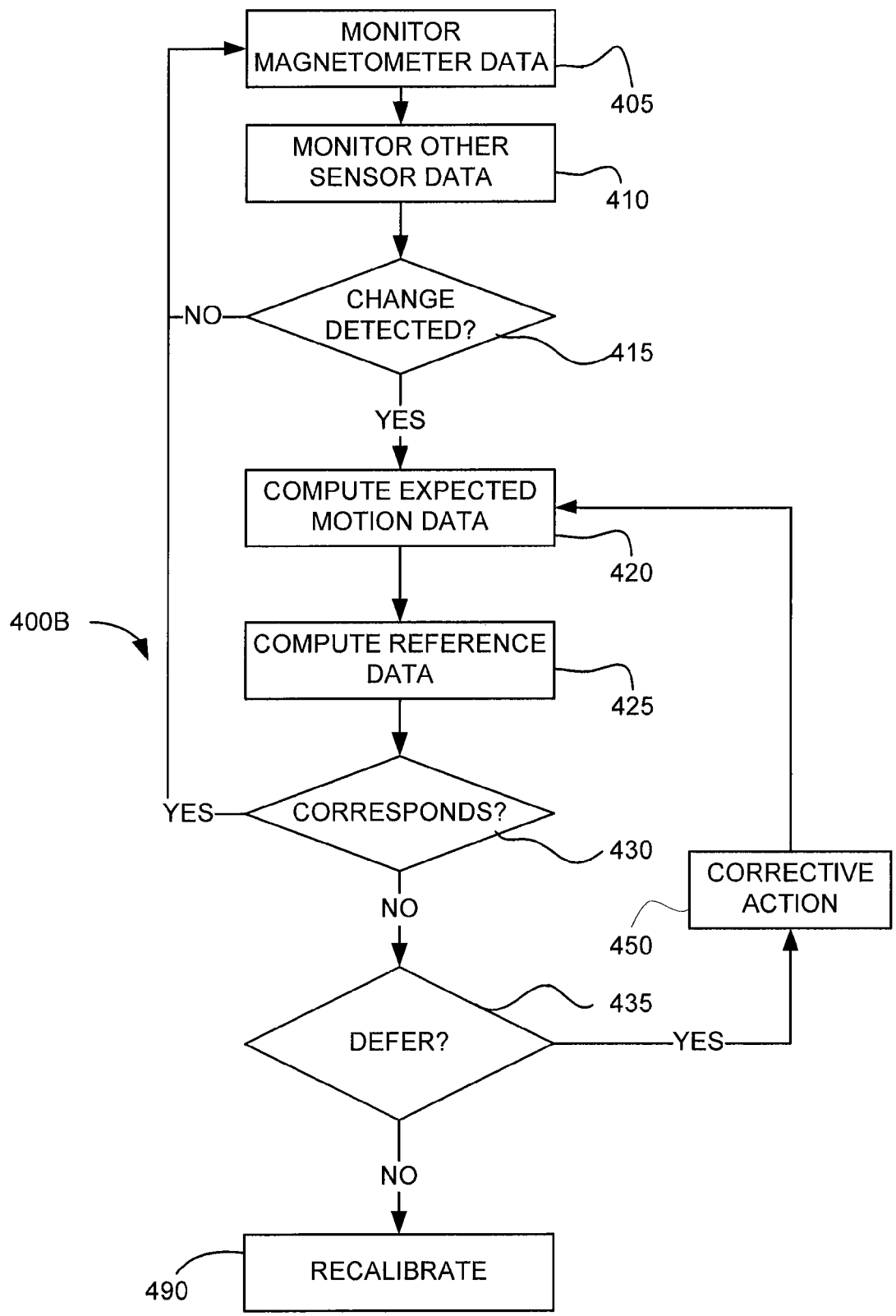
FIG. 4B is a flow chart illustrating an interference detection process in accordance with at least one other embodiment.

Referring now to FIG. 4B, there is shown a flow chart illustrating an interference detection process, in accordance with at least one embodiment. Acts 405, 415, 420, 430, 435, 450 and 490 of process 400B are generally analogous to acts 405, 415, 420, 430, 435, 450 and 490 of process 400A, and the reader is directed to the description of FIG. 4A for further details.

At 410, non-magnetometer sensor data, such as accelerometer sensor data and gyroscope sensor data, can be monitored or sampled using the appropriate sensors.

Non-magnetometer sensor data may be monitored continuously, at periodic intervals (e.g., at a predetermined sampling rate), or in response to certain stimuli. For example, gyroscope sensor data may be sampled when magnetometer sensor data indicates a change in magnetic field.

At 425, reference data, comprising data characterizing a reference motion of the mobile device, is computed based on non-magnetometer sensor data from one or more non-magnetometer sensors (e.g., accelerometer, gyroscope, GPS unit, etc.), monitored for example at 410. For example, the reference data may characterize a motion (e.g., translation, rotation, etc.) of the mobile device in the given time interval. Alternatively, the reference data may indicate a current position and orientation of the mobile device.

Referring now to FIGS. 5A to 5D, there are provided examples of an interference detection process, such as process 400A or 400B, in operation.

Figure 5A:
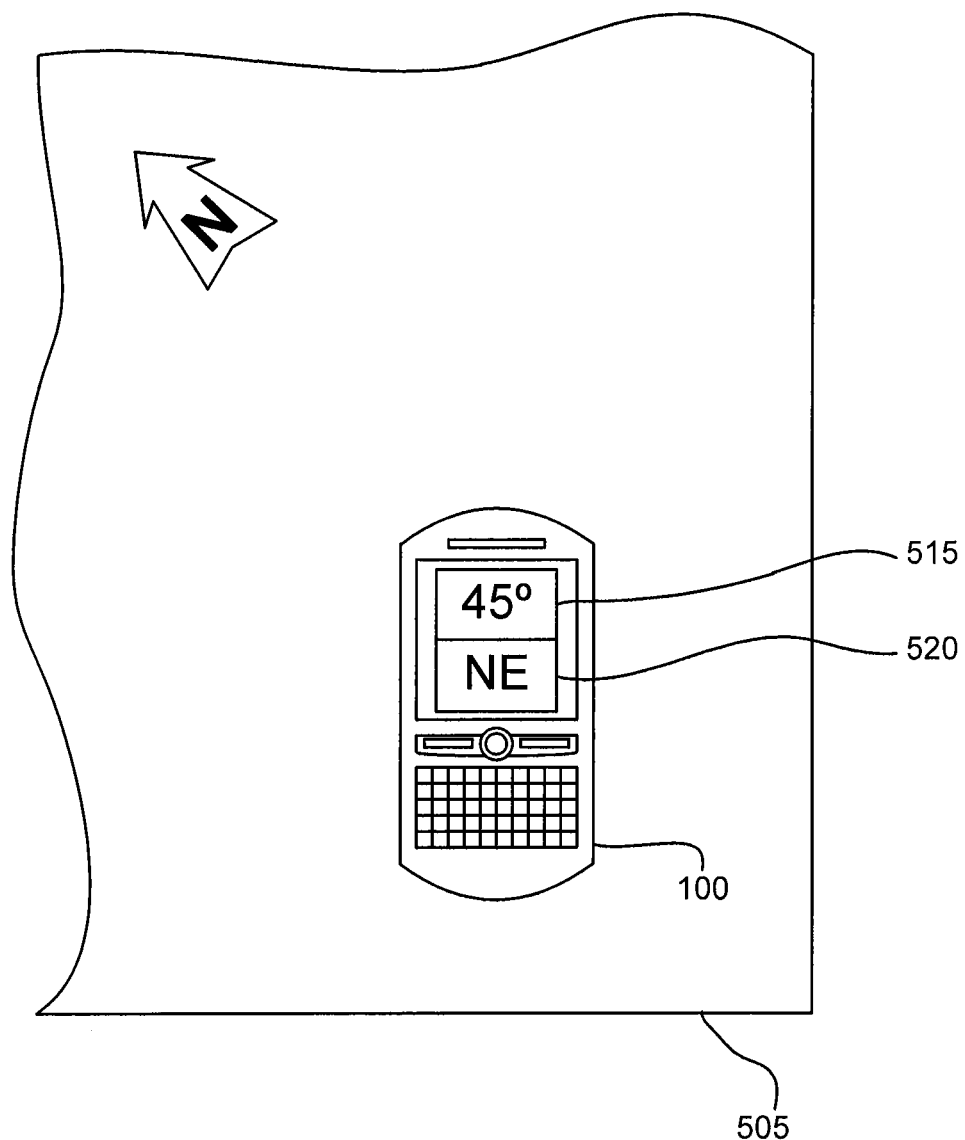
FIGS. 5A to 5F illustrate examples of an interference detection process in operation.

Referring to FIG. 5A in particular, there is illustrated a mobile device 100, which is positioned on a surface 505, such as a tabletop or desk.

Mobile device 100 can be configured to provide a digital compass application, which determines a magnetic bearing using a magnetometer (e.g., magnetometer 156 in FIG. 1), and displays a visual indication of the determined bearing as output on display 110. In the illustrated example, the output comprises a numerical bearing indication 515. Optionally, an indication 520 of the cardinal or intercardinal direction associated with the numerical bearing 515 may be additionally or alternately displayed.

In FIG. 5A, there is shown mobile device 100 in which the magnetometer 156 is calibrated, and there are no significant sources of external magnetic interference. Mobile device 100 is physically oriented towards a magnetic bearing of 45° from north. Accordingly, at time t0, magnetometer 156 determines this directional bearing and displays the numerical bearing 515 as "45°" and the indication 520 as "NE" (i.e., northeast).

Figure 5B:
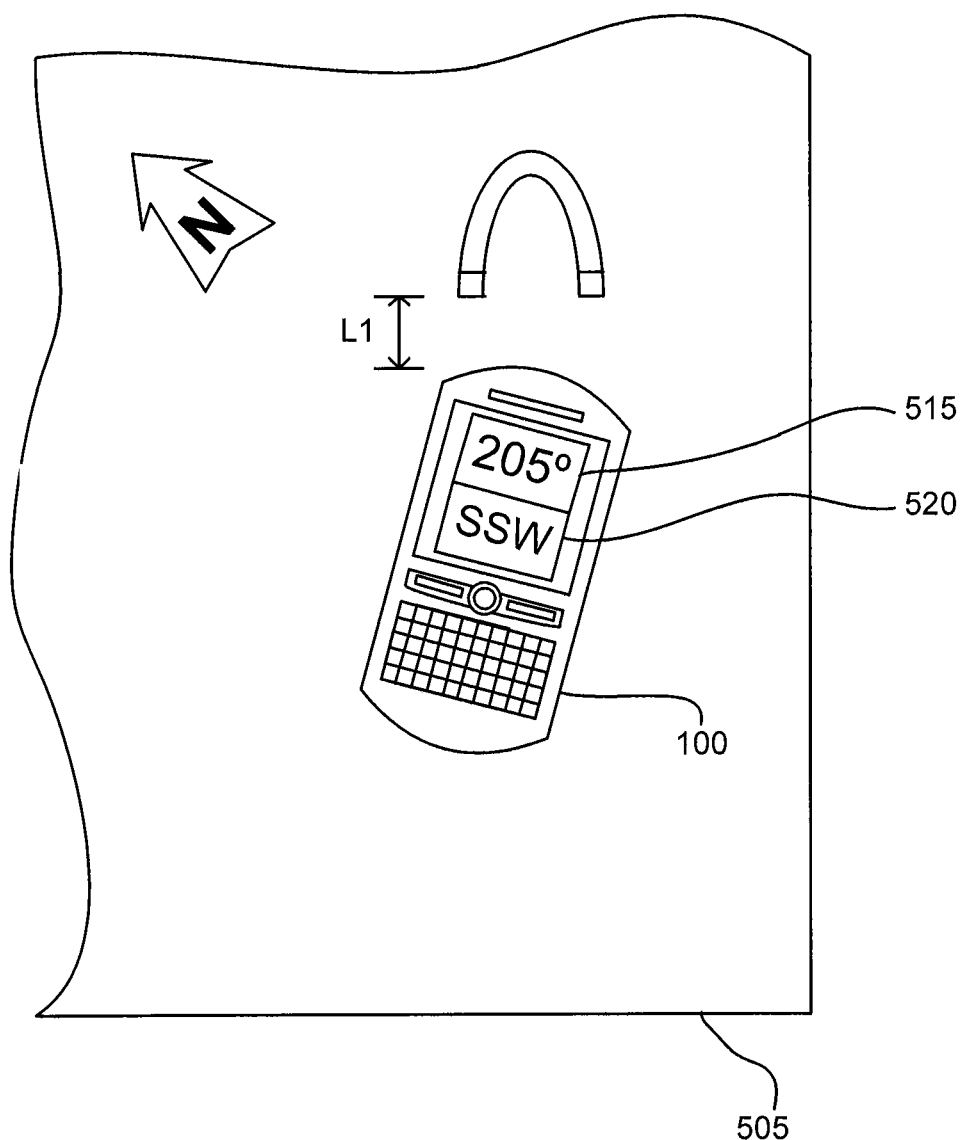

Referring now to FIG. 5B, mobile device 100 of FIG. 5A has been rotated clockwise by 15° relative to its previous orientation. In addition, mobile device 100 has been translated along surface 505, such that mobile device is at a distance L1 from a permanent magnet 530. At distance L1, magnet 530 is a source of magnetic interference that significantly affects the quality of magnetic sensor data from magnetometer 156.

For the purposes of illustration in this particular example, magnet 530 is shown as a source of magnetic interference. However, it will be appreciated that magnet 530 could represent some other source of magnetic interference (e.g., doorway, vehicle, etc.).

At time t1, gyroscope 154 of mobile device registers an actual clockwise rotation by 15° from the previous position, accordingly, reference data may be computed that indicates a corresponding clockwise rotation by 15° (the exact degree of rotation may vary depending on the specific circumstances). However, at time t1, magnetometer 156 indicates a magnetic bearing of 205°, for example, due to the magnetic interference caused by magnet 530. Accordingly, data from magnetometer 156 suggests that the mobile device has been rotated in the clockwise direction by 160° (that is, the current bearing of 205° minus the initial bearing of 45°). Accordingly, mobile device 100 may display the numerical bearing 515 erroneously as "205°" and the indication 520 erroneously as "SSW" (i.e., south-southwest).

Figure 5C:
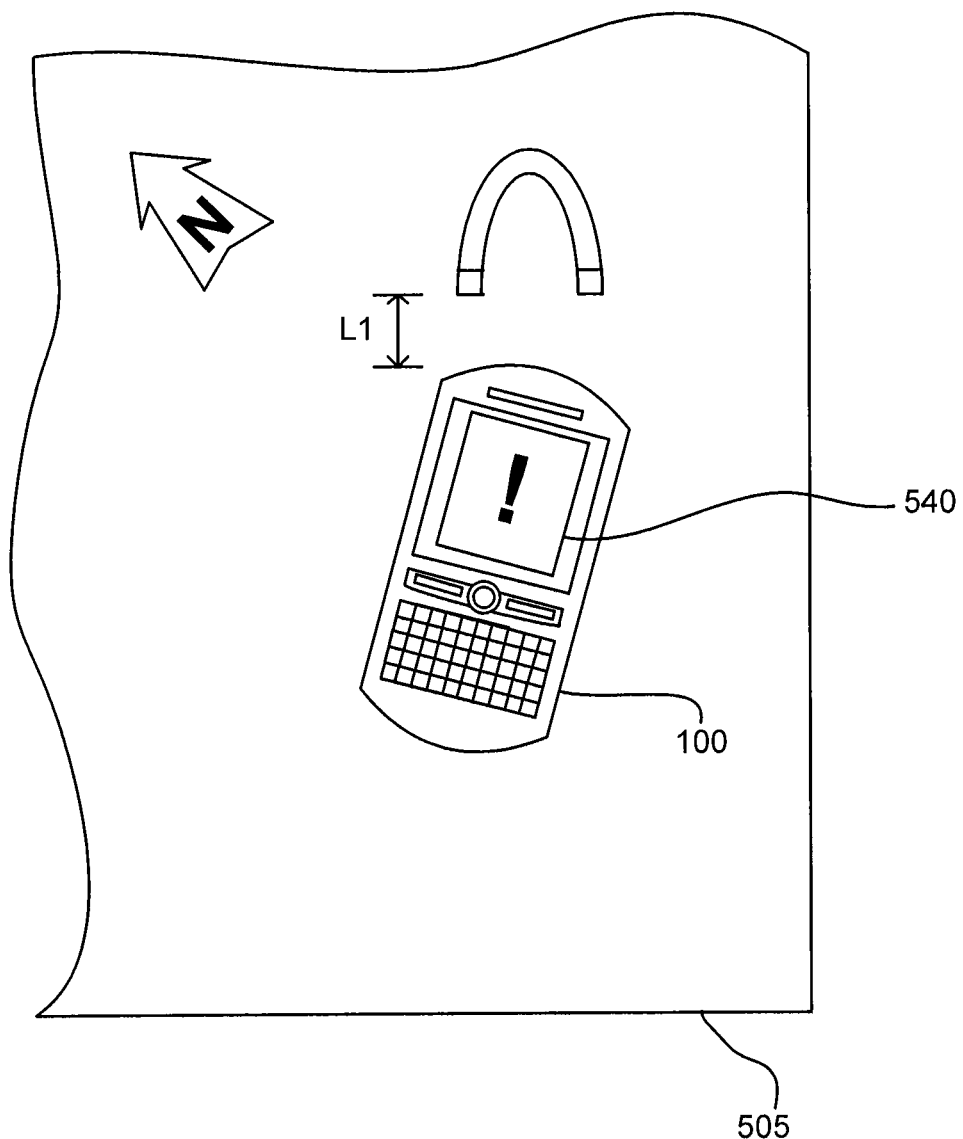

Referring now to FIG. 5C, mobile device 100 determines that expected motion of the mobile device based on the magnetometer sensor data does not correspond to reference data (e.g., based on non-magnetometer sensor data) by using, for example, process 400A or 400B. Accordingly, rather than assuming that the interference is persistent, and then recalibrating the magnetometer, mobile device 100 displays an indication 540 to a user of mobile device 100 to move mobile device 100 away from any potential source of magnetic interference, or to remove the potential source of magnetic interference. Optionally, mobile device 100 may additionally or alternately display another type of indication that the magnetic bearing is anomalous, for example by flashing the numerical bearing 515, changing the color of numerical bearing 515, displaying a warning icon, or any other suitable indication.

In some embodiments, during a period in which the expected motion data does not correspond to the reference data, the displayed bearing indications may be based at least in part on non-magnetometer sensor data. For example, the magnetic bearing may be simulated based on the non-magnetometer sensor data, and the magnetometer sensor data can be ignored temporarily. Alternatively, a simulated magnetic bearing may be computed based on a weighted average of the magnetometer sensor data and the non-magnetometer sensor data.

Figure 5D:
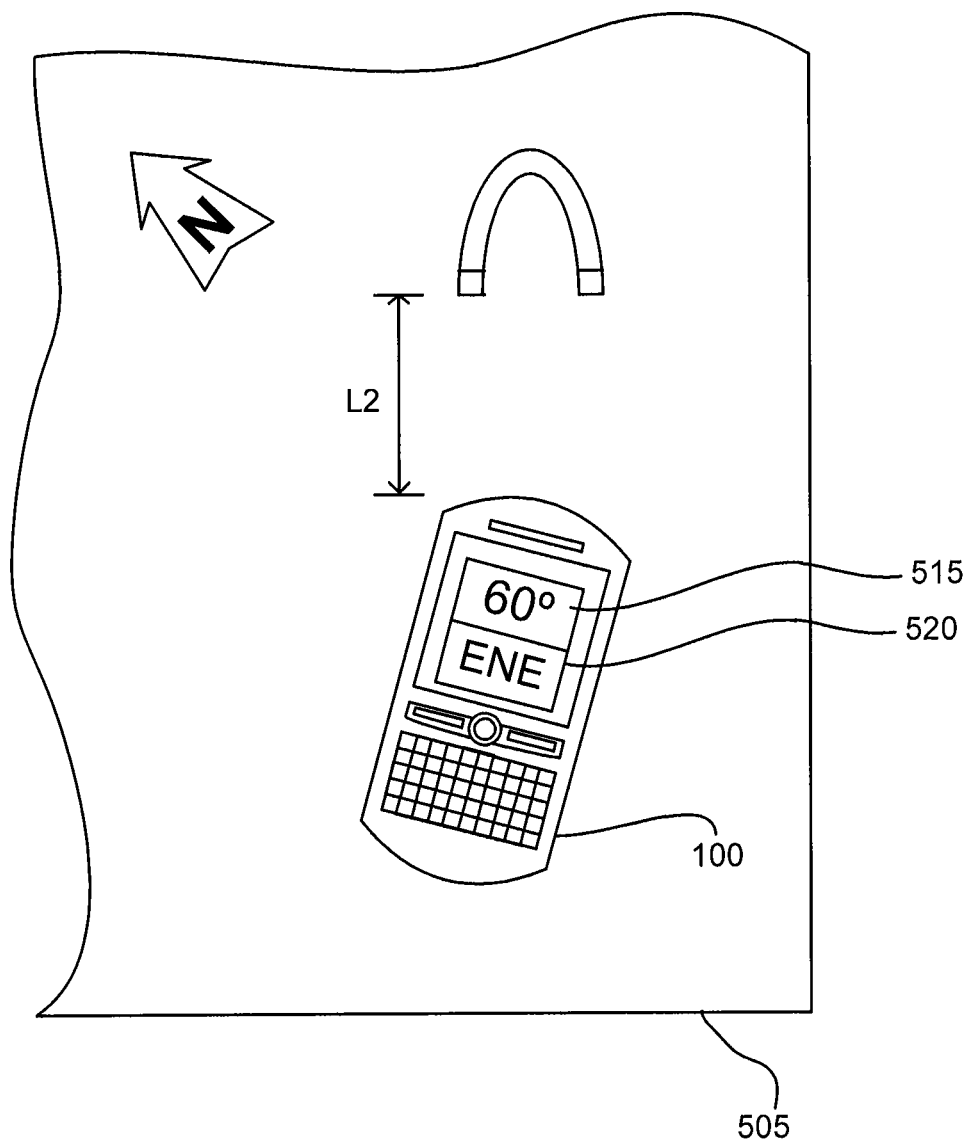

Referring now to FIG. 5D, at time t2, motion data from accelerometer 152 indicates that mobile device 100 has been translated in one direction, for example, because the user has placed mobile device 100 at a further distance L2 from magnet 530. However, mobile device 100 has not been rotated relative to its previous orientation at time t1. At a distance L2, the magnetic interference from magnet 530 is negligible and does not significantly affect the quality of magnetic sensor data from magnetometer 156.

At time t2, magnetometer 156 determines a new magnetic bearing of 60°. Mobile device 100 computes new expected motion data for the time interval between t0 and t2 (or between t1 and t2), and determines that the new expected motion data corresponds to reference data. That is, the reference data (based on gyroscope data) indicates a 15° clockwise rotation between t0 and t1, followed by no rotation between t1 and t2, providing a total clockwise rotation of 15° between time t0 and t2. Correspondingly, magnetometer sensor data indicates an initial bearing of 45° at time t0 and a final bearing of 60° at time t2, providing a net clockwise rotation of 15°. Accordingly, mobile device 100 displays the correct numerical bearing 515 as "60°" and the indication 520 as "ENE" (i.e., east-northeast).

Figure 5E:
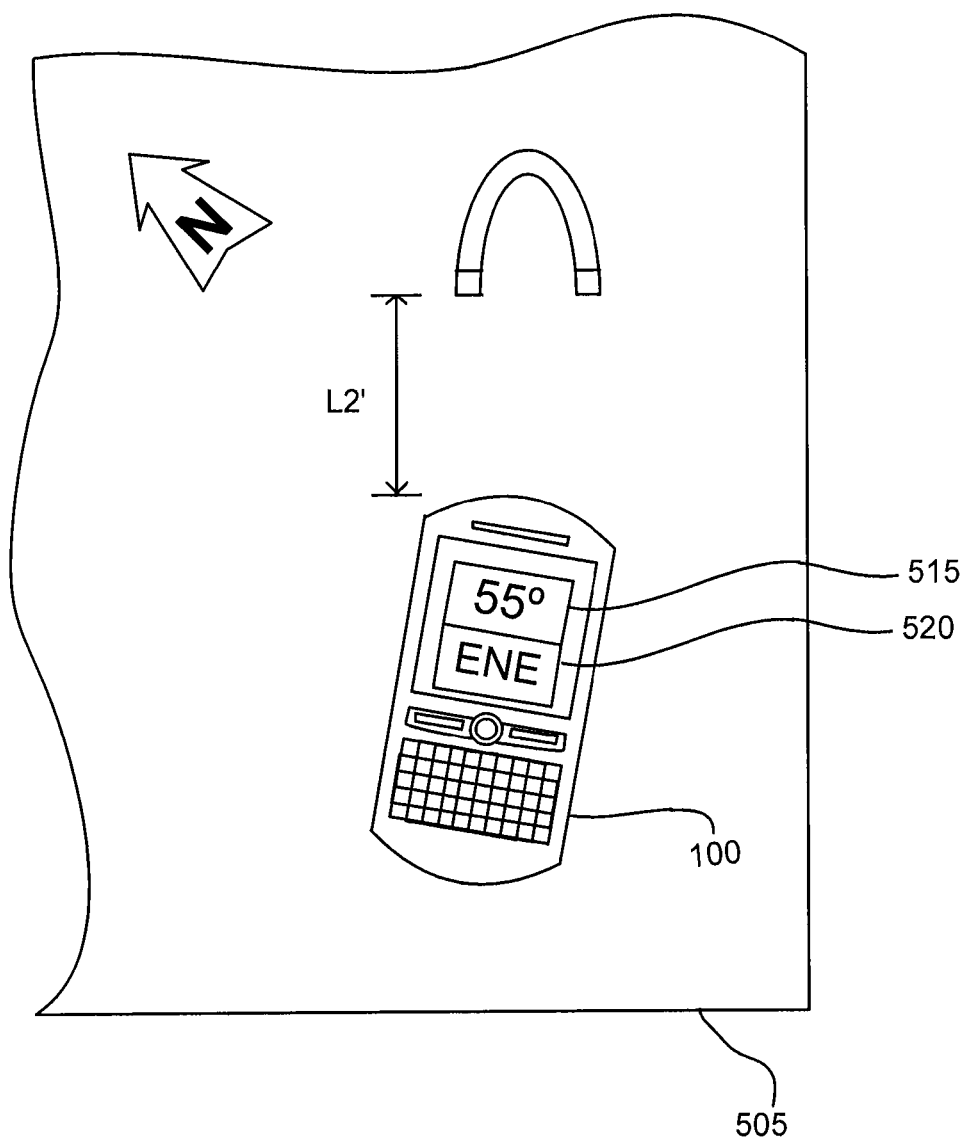

Referring now to FIG. 5E, there is shown an alternative scenario in which the mobile device undergoes a further rotation between t1 and t2, while being translated the further distance L2. That is, at time t2, motion data from gyroscope 154 indicates a further rotation of mobile device 100 by 5° in a counterclockwise direction, which corresponds to the actual rotation of mobile device 100. Accordingly, new reference data may be computed indicating the 5° counterclockwise rotation between t1 and t2 (or a net 10° clockwise rotation between t0 and t2). As previously noted, at the distance L2, the magnetic interference from magnet 530 is negligible and does not significantly affect the quality of magnetic sensor data from magnetometer 156.

At time t2, magnetometer 156 determines a new magnetic bearing of 55°. Mobile device 100 computes new expected motion data for the time interval between t0 and t2, and determines that the new expected motion data corresponds to reference data (also computed for the time interval between t0 and t2). That is, the reference data (based on gyroscope data) indicates a 15° clockwise rotation between t0 and t1, followed by a counterclockwise rotation of 5° between t1 and t2, providing a net clockwise rotation of 10° between time t0 and t2. Correspondingly, magnetometer sensor data indicates an initial bearing of 45° at time t0 and a final bearing of 55° at time t2, providing a net clockwise rotation of 10°. Accordingly, mobile device 100 displays the correct numerical bearing 515 as "55°" and the indication 520 as "ENE" (i.e., east-northeast).

Unlike the examples in FIGS. 5D and 5E above, in other cases even after further movement of mobile device 100, the movement of mobile device 100 computed from magnetometer sensor data may not correspond to the computed movement based on non-magnetometer sensor data (e.g., because the source of the interference has not been completely removed). In such case, mobile device 100 may continue to display indications prompting a user to move mobile device 100 away from any potential source of magnetic interference, or to remove the potential source of magnetic interference.

Figure 5F:
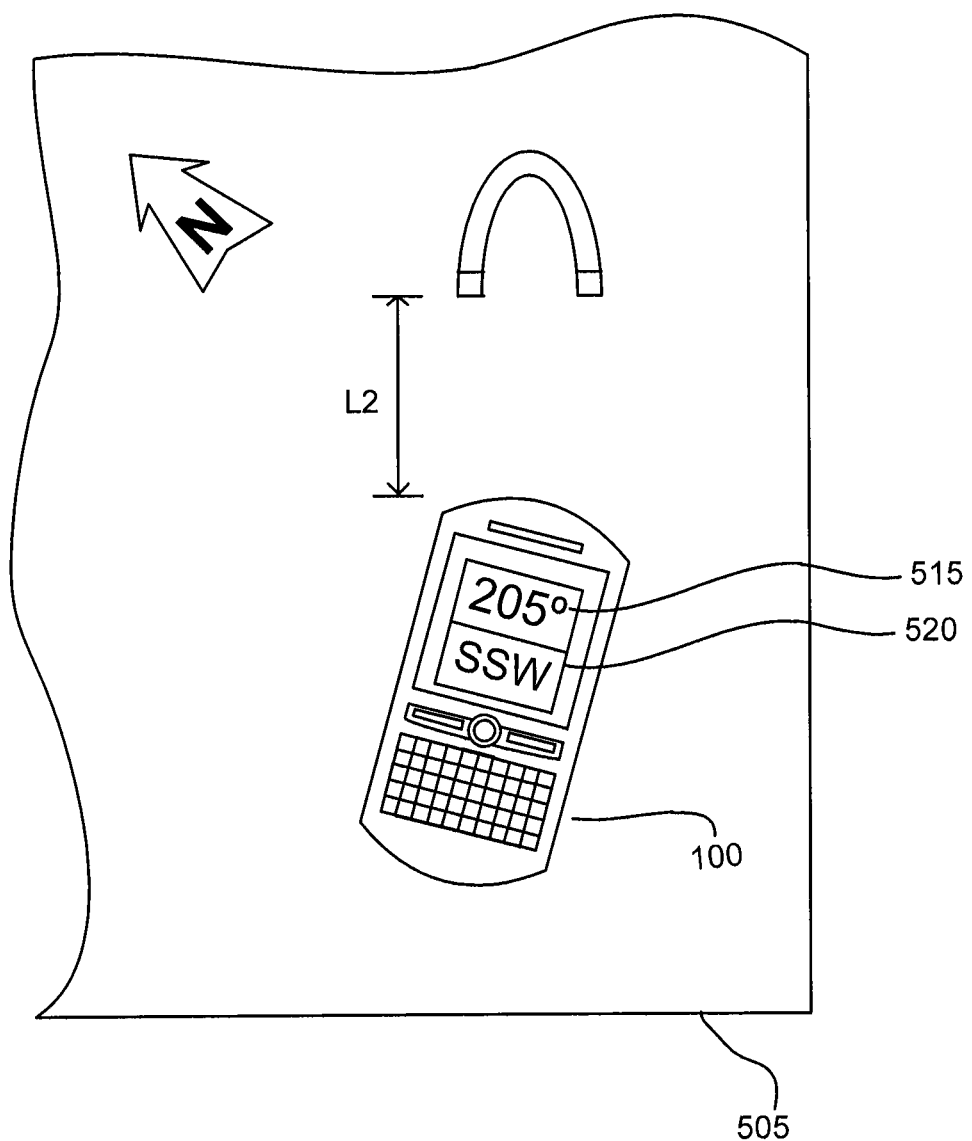

In some cases, after a predetermined period of time recalibration may be forced, for example because a maximum deferral period has been exceeded. Referring now to FIG. 5F, there is illustrated a case in which the magnetic interference is removed, but recalibration is still needed.

As above, at time t2, motion data from accelerometer 152 indicates that mobile device 100 has been translated in one direction, for example, because the user has placed mobile device 100 at a different distance L2' from magnet 530. Unlike at the distance L2, the magnetic interference from magnet 530 remains non-negligible at the distance L2' and may continue to affect the quality of magnetic sensor data from magnetometer 156.

Accordingly, in contrast to the mobile device of FIG. 5D, at time t2, magnetometer 156 of the mobile device erroneously continues to display a magnetic bearing of 205°. Alternately, in some cases, the magnetic bearing may change but remain erroneous.

Accordingly, if the maximum deferral period has been exceeded, mobile device 100 can cease deferral of the recalibration, and initiate recalibration of magnetometer 156 of mobile device 100, either in a foreground or background recalibration.

The systems, processes and methods of the described embodiments are capable of being implemented in a computer program product comprising a non-transitory computer readable medium that stores computer usable instructions for one or more processors that cause the one or more processors to operate in a specific and predefined manner to perform the functions described herein. The medium may be provided in various forms, including as volatile or non-volatile memory provided on optical, magnetic or electronic storage media.

It should be understood that various modifications can be made to the embodiments described and illustrated herein, without departing from the embodiments, the general scope of which is defined in the appended claims.

The invention claimed is:

1. A method for detecting magnetic interference in a mobile device, the method comprising:
   monitoring magnetometer sensor data generated by a magnetometer for a first time interval;
   detecting a change in the magnetometer sensor data for the first time interval;
   computing expected motion data that characterizes an expected motion of the mobile device based on the magnetometer sensor data;
   comparing the expected motion data with reference data; and
   deferring recalibration of the magnetometer when the expected motion data does not correspond to the reference data;
   wherein the deferring comprises displaying an indication of a corrective action in a user interface of the mobile device.

2. The method of claim 1, further comprising, prior to computing the expected motion data, computing the reference data of the mobile device based on non-magnetometer sensor data.

3. The method of claim 2, wherein the non-magnetometer sensor data is generated at the mobile device.

4. The method of claim 2, wherein the non-magnetometer sensor data is generated by one or more non-magnetometer sensors in the first time interval.

5. The method of claim 4, wherein the one or more non-magnetometer sensors is selected from the group consisting of: an accelerometer, a gyroscope and a GPS unit.

6. The method of claim 1, wherein the indication identifies that magnetic interference is present near the mobile device.

7. The method of claim 1, wherein the corrective action comprises moving the mobile device.

8. The method of claim 1, wherein the corrective action comprises removing a possible source of the magnetic interference.

9. The method of claim 1, wherein the deferring comprises monitoring the magnetometer sensor data for a second time interval and computing new expected motion data of the mobile device based on the magnetometer sensor data for the second time interval, and wherein, when the new expected motion data does not correspond to new reference data, the method further comprises recalibrating the magnetometer.

10. The method of claim 9, further comprising, when the new expected motion data corresponds to the new reference data, cancelling recalibration of the magnetometer.

11. The method of claim 1, wherein the magnetic field change exceeds a predetermined change threshold.

12. A non-transitory computer readable medium storing instructions executable by a processor of a mobile device, the instructions for carrying out a method for detecting magnetic interference in the mobile device, the method comprising:

monitoring magnetometer sensor data generated by a magnetometer for a first time interval;

detecting a change in the magnetometer sensor data for the first time interval;

computing expected motion data that characterizes an expected motion of the mobile device based on the magnetometer sensor data;

comparing the expected motion data with reference data; and deferring recalibration of the magnetometer when the expected motion data does not correspond to the reference data;

wherein the deferring comprises displaying an indication of a corrective action in a user interface of the mobile device.

13. A mobile device comprising:

a magnetometer;

one or more sensors;

a processor coupled to the magnetometer and the one or more sensors, the processor configured to:

monitor magnetometer data generated by the magnetometer for a first time interval;

detect a change in the magnetometer data for the first time interval;

compute expected motion data that characterizes an expected motion of the mobile device based on the magnetometer data;

compare the expected motion data with reference data;

defer recalibration of the magnetometer when the expected motion data does not correspond to the reference data; and display an indication of a corrective action in a user interface of the mobile device when deferring recalibration.

14. The mobile device of claim 13, wherein the processor is further configured to, prior to computing the expected motion data, compute the reference data of the mobile device based on sensor data generated by the one or more sensors.

15. The mobile device of claim 14, wherein the sensor data is generated by the one or more sensors in the first time interval.

16. The mobile device of claim 13, wherein the indication identifies that magnetic interference is present near the mobile device.

17. The mobile device of claim 13, wherein the corrective action comprises moving the mobile device.

18. The mobile device of claim 13, wherein the corrective action comprises removing a possible source of the magnetic interference.

19. The mobile device of claim 13, wherein, when deferring recalibration, the processor is further configured to monitor the magnetometer data for a second time interval and compute new expected motion data of the mobile device based on the magnetometer data for the second time interval, and wherein, when the new expected motion data does not correspond to new reference data, the processor is further configured to recalibrate the magnetometer.

20. The mobile device of claim 19, wherein, when the new expected motion data corresponds to the new reference data, the processor is configured to cancel recalibration of the magnetometer.

21. The mobile device of claim 13, wherein the magnetic field change exceeds a predetermined change threshold.

22. The mobile device of claim 13, wherein the one or more sensors is selected from the group consisting of: an accelerometer, a gyroscope and a GPS unit.

* * * * *